United States Patent
Lin

(10) Patent No.: US 7,956,333 B2
(45) Date of Patent: Jun. 7, 2011

(54) MOVING MODULE OF A WAFER ION-IMPLANTING MACHINE

(75) Inventor: Ting-Wei Lin, Banciao (TW)

(73) Assignee: Inotera Memories, Inc., Taoyuan County (TW)

( * ) Notice: Subject to any disclaimer, the term of this patent is extended or adjusted under 35 U.S.C. 154(b) by 211 days.

(21) Appl. No.: 12/457,929

(22) Filed: Jun. 25, 2009

(65) Prior Publication Data

US 2010/0218720 A1    Sep. 2, 2010

(30) Foreign Application Priority Data

Mar. 2, 2009    (TW) ............................. 98106635 A

(51) Int. Cl.
G21K 5/10    (2006.01)
(52) U.S. Cl. .............................. 250/442.11; 250/492.21
(58) Field of Classification Search ............. 250/442.11, 250/492.21
See application file for complete search history.

(56) References Cited

U.S. PATENT DOCUMENTS 7,239,939 B2 *    7/2007    Mori et al. ................... 700/213

* cited by examiner

*Primary Examiner* — Kiet T Nguyen
(74) *Attorney, Agent, or Firm* — Rosenberg, Klein & Lee

(57) ABSTRACT

A moving module of a wafer ion-implanting machine includes a wafer carrier, a moving shaft, a base, a pair of first magnets, a fixture body, and a plurality of second magnets. One end of the wafer carrier is pivotally connected to a wafer tray; and the other end is fixed onto one end of the moving shaft. The base is fixed to the other end of the moving shaft. The moving shaft drives the wafer carrier and the base to move lengthwise. The pair of first magnets is fixed to the base. The fixture body is located between the pair of first magnets. The second magnets are fixed onto the fixture body and one of them forms compelling magnetic force between one of the first magnets. Thereby, the friction generated by contacting any of the first magnets with the fixture body can be prevented, thus increasing the production yield.

16 Claims, 7 Drawing Sheets

MOVING MODULE OF A WAFER ION-IMPLANTING MACHINE

BACKGROUND OF THE INVENTION

1. Field of the Invention

The present invention relates to a semiconductor processing machine with a modified structure, and more particularly to a wafer ion-implanting machine with a modified structure.

2. Description of Related Art

In the course of ion implantation, in order to successfully allow the ions to be implanted to enter a wafer at various incident angles, the wafer ion-implanting machine must be equipped with a moving module responsible for moving the wafer up and down so that the ions may be implanted at corresponding incident angles. Referring to FIG. 1 and FIG. 2, the conventional moving module of the wafer ion-implanting machine includes a wafer carrier 1a, a moving shaft 2a, a base 3a, a pair of air cushions 4a, and a fixture body 5a. A wafer tray 11a is further pivotally connected to a top of the wafer carrier 1a, while a bottom of the wafer carrier 1a is fixed onto a top of the wafer tray 2a. The moving shaft 2a can move lengthwise and therefore drive the wafer carrier 1a and the base 3a to move lengthwise. The fixture body 5a is located between the pair of air cushions 4a. Each of the cushions 4a has a plurality of tiny holes 41a to which air is input through a pipe 6a. The input air strikes at opposite sides of the fixture body 5a from the holes 41a. The base 3a can be driven by the moving shaft 2a to stably move lengthwise, provided that the air pressure on the opposite sides of the fixture body 5a remains balanced. In order words, for a traditional wafer ion-implanting machine, only when the air cushions 4a is kept away from contact with the fixture body 5a can the frictional force that is generated by physically contacts between the fixture body 5a and the air cushions 4a be prevented from occurring; furthermore, once the frictional force occurs, then the moving shaft 2a is prevented from going up and down freely without any rotation, which would cause the wafer carrier 1a to be tilted and further affect the incident angles of implanting ions.

In practice, it is not easy to implement the balance of the air pressure so as to prevent the occurrence of frictional force between the air cushions 4a and the fixture body 5a. Long-term friction would significantly damage the air cushions 4a and the fixture body 5a, causing an increase in maintenance cost. Furthermore, friction between the air cushions 4a and the fixture body 5a causes the wafer carrier 1a to become tilted when the wafer carrier 1a moves up and down. Unsteady movement of the wafer carrier 1a disadvantageously influences the incident angle of implanting ions and therefore reduces the wafer yield.

SUMMARY OF THE INVENTION

It is one object of the present invention to provide a moving module of a wafer ion-implanting machine, which can increase the wafer yield and reduce maintenance cost.

To achieve the above-mentioned objectives, the present invention provides a moving module of a wafer ion-implanting machine, wherein the moving module includes a wafer carrier, a moving shaft, a base, a pair of first magnets, a fixture body, and a plurality of second magnets. One end of the wafer carrier is pivotally connected to a wafer tray. The other end of the wafer carrier is fixed onto one end of the moving shaft so that the moving shaft drives the wafer carrier to move lengthwise. The base is fixed to the other end of the moving shaft, so that the moving shaft drives the base to move lengthwise. The pair of first magnets is fixed to the base. The fixture body is located between the pair of first magnets. The second magnets are fixed onto the fixture body and one of them forms a compelling magnetic force between one of the first magnets.

The moving module of the present invention offers the following advantages. By selecting proper magnet flux densities for the first magnets and the second magnets, it is easy to control the compelling magnetic force that is between the first magnets and the second magnets, so that the first magnets will not come into contact with the second magnets, thereby reducing the maintenance cost. Since the moving shaft does not rotate because there is no friction between the first magnets and the second magnets, the wafer carrier will not tilt during operation. Therefore, the angle of ion implantation is controlled more accurately, thus increasing the wafer yield.

In order to further understand the techniques, means, and effects that the present invention takes for achieving the prescribed objectives, the following detailed descriptions and appended drawings are hereby referred; such that, through which the purposes, features, and aspects of the present invention can be thoroughly and concretely appreciated; however, the appended drawings are merely provided for reference and illustration, without any intention to be used for limiting the present invention.

DETAILED DESCRIPTION OF THE PREFERRED EMBODIMENTS

Figure 1:
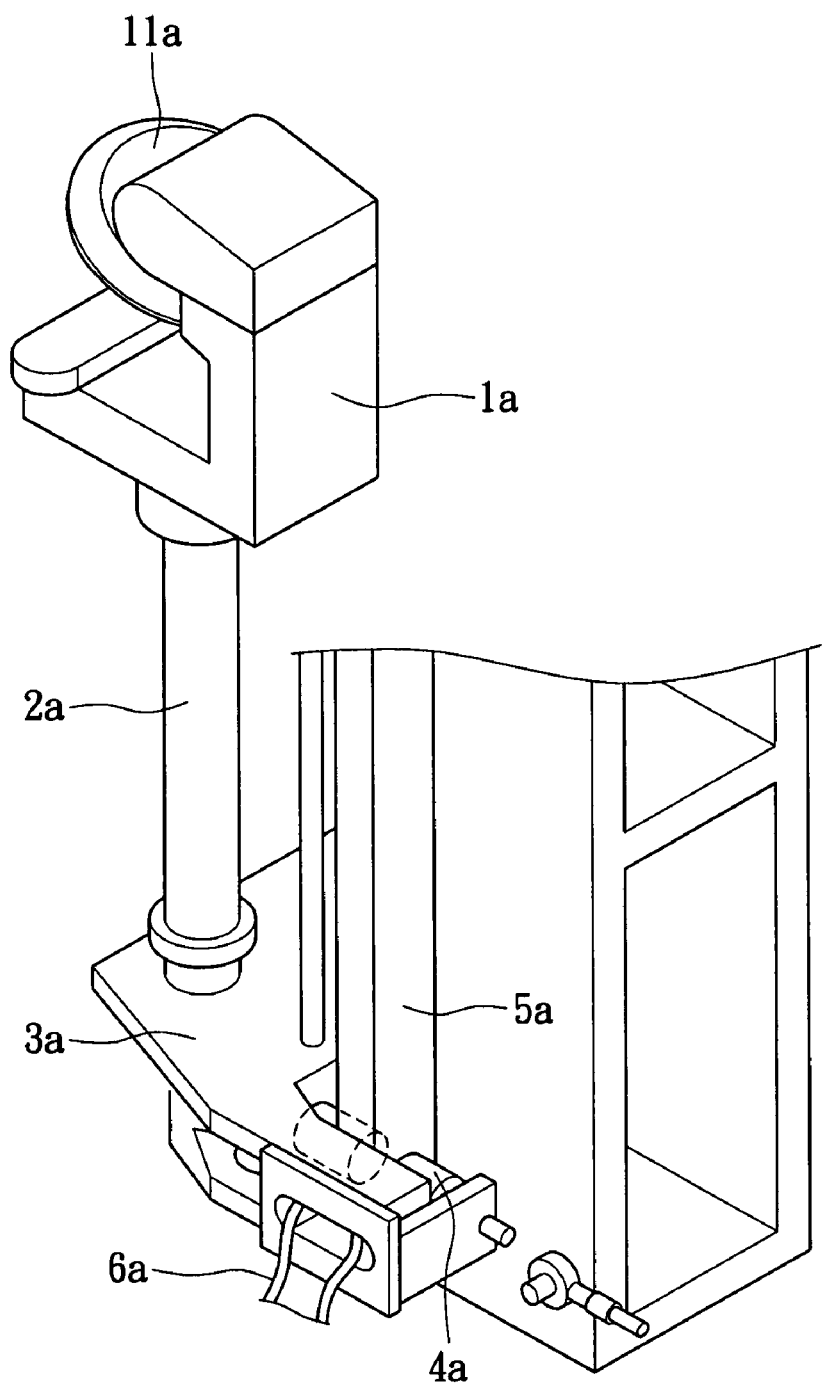
FIG. 1 is a perspective view showing a conventional moving module of a wafer ion-implanting machine.
Figure 2:
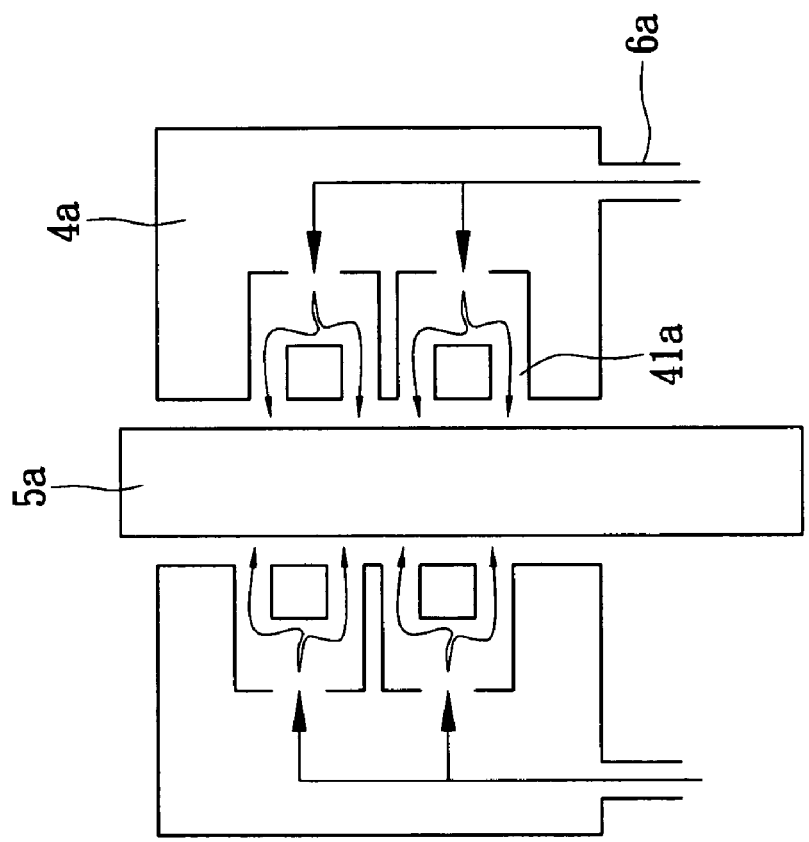
FIG. 2 is a schematic view showing an internal air pressure acting on a fixture body of a conventional air cushion.
Figure 3:
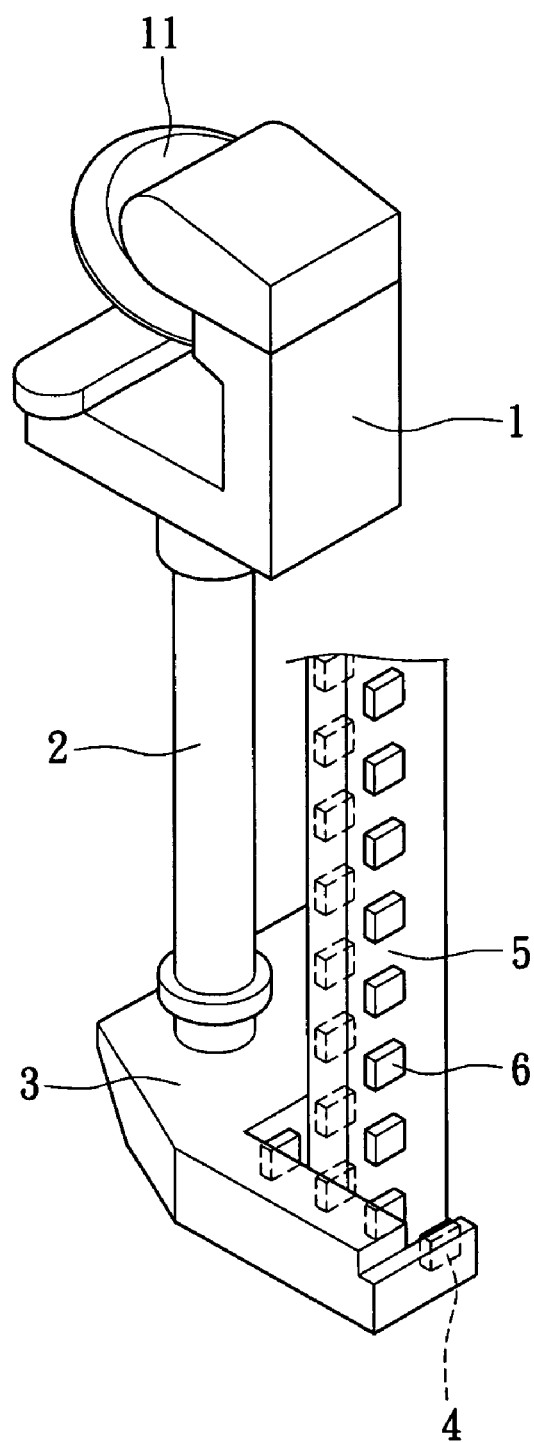
FIG. 3 is a perspective view showing an idle status of a moving module of a wafer ion-implanting machine according to the present invention.
Figure 4:
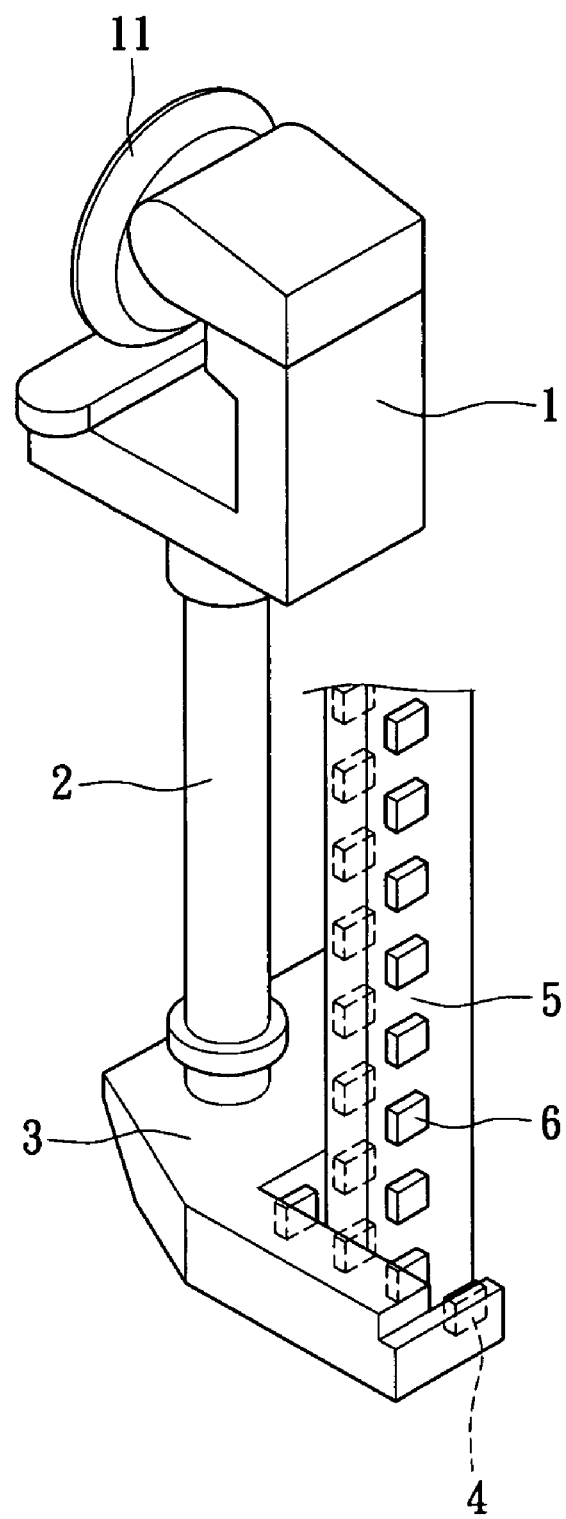
FIG. 4 is a perspective view showing a working status of the moving module of the wafer ion-implanting machine according to the present invention.

Referring now to FIG. 3, the present invention provides a moving module of a wafer ion-implanting machine, wherein the moving module includes a roughly L-shaped wafer carrier 1, a moving shaft 2, a base 3, a pair of first magnets 4, a fixture body 5, and a plurality of second magnets 6. A top of the wafer carrier 1 is pivotally connected to a wafer tray 11, and the wafer tray 11 is used to carry dynamic memory wafer. The wafer tray 11 can spin counterclockwise or clockwise on the wafer carrier 1. A bottom of the wafer carrier 1 is fixed onto a top of the moving shaft 2. The base 3 is fixed to a bottom of the moving shaft 2. The moving shaft 2 can move lengthwise so as to drive the wafer carrier 2 and the base 3 to move lengthwise. The moving shaft 2 as shown in FIG. 3 is in idle status while the moving shaft 2 in FIG. 4 is in working status and is moving lengthwise when the wafer tray 11 is vertical to the wafer carrier 1.

Figure 5:
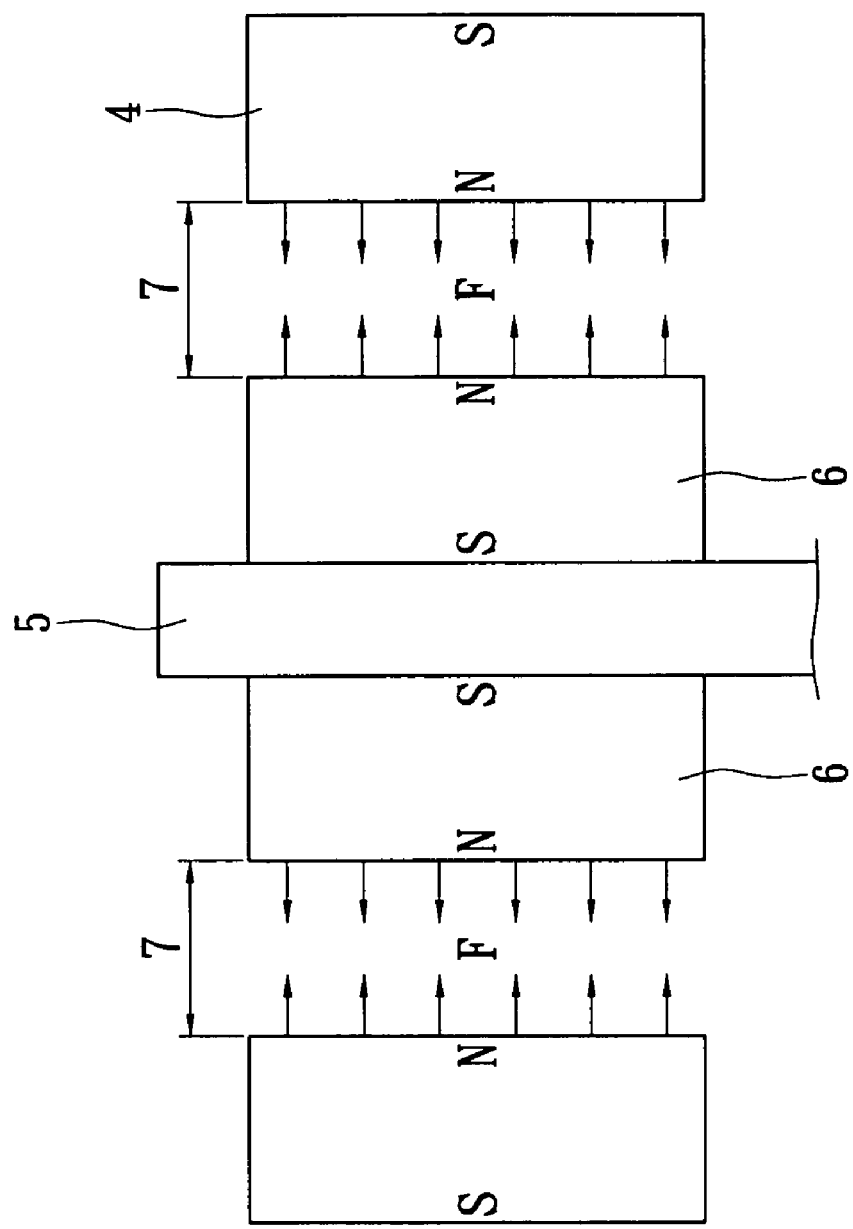
FIG. 5 is a schematic view showing the action of a magnetic force between a first magnet and a second magnet on a fixture body according to one embodiment of the present invention.

The first magnets 4 are fixed on one end of the base 3. The fixture body 5 is located between the pair of first magnets 4. Those second magnets 6 are fixed on opposite sides of the fixture body 5 as shown in FIG. 5. There is a gap 7 between one of the second magnets 6 and one of the first magnets 4. The magnetic property at the ends of the first magnets 4 facing the second magnets 6 is the same as that at the ends of the second magnets 6 facing the first magnets 4, so that there is a compelling magnetic force between the first magnets 4 and the second magnets 6.

The material of the first magnets 4 and the second magnets 6 can be permanent magnets or electrically induced magnets. Between those materials, the permanent magnets are preferred. The first magnets 4 and the second magnets 6 can be the same size, in the shape of rectangle. The amount of the second magnets 6 on one side of the fixture body 5 is equal to that of the other side of the fixture body 5.

Formula of calculating the magnet force and magnet flux density illustrates that it is practicable to control the compelling magnetic force between the first magnets 4 and the second magnets 6 by adapting a proper gap 7.

$$F = \frac{1}{4\pi\mu} \times \frac{\phi_1 \phi_2}{r^2}$$

Therein, F indicates the magnetic force, in unit of Newton, between the first magnet 4 and the magnet 6; r indicates the gap 7 between the first magnet 4 and the second magnet 6; $\phi_1$ indicates the magnet flux (wb) of the first magnet 4; and $\phi_2$ indicates the magnet flux (wb) of the second magnet 6.

$$B_1 = \frac{\phi_1}{A_1}$$

Therein, $B_1$ indicates the magnet flux density (guass) of the first magnet 4; and $A_1$ indicates the cross-sectional area formed by orthogonally intersecting the first magnet 4 with the magnetic force line.

$$B_2 = \frac{\phi_2}{A_2}$$

Therein, $B_2$ indicates the magnet flux density (guass) of the second magnet 6; $A_2$ indicates the cross-sectional area formed by orthogonally intersecting the second magnet 6 with the magnetic force line.

If the compelling magnetic force between the first magnet 4 and the second magnet 6 is 980 Newton, and the gap 7 between the first magnet 4 and the second magnet 6 is 2 mm, then the magnet flux is calculated to be $6.19 \times 10^{-8}$ wb$^2$ ($\phi_1\phi_2$) via the above formula. If the magnet flux ($\phi_1$) of the first magnet 4 is equal to the magnet flux ($\phi_2$) of the second magnet 6, then the magnet flux is divided respectively by the cross-sectional areas of the first magnet 4 and the second magnet 6 that are formed by intersecting orthogonally to the magnet force line, so as to obtain the magnet flux densities for the first magnet 4 and the second magnet 6. By selecting proper magnet flux densities for the first magnet 4 and the second magnet 6, it is easy to control the compelling magnetic force between them, so that a constant gap 7 can be maintained at about 2 mm to ensure that the first magnet 4 is not in contact with the second magnet 6 and not in contact with the fixture body 5.

Figure 6:
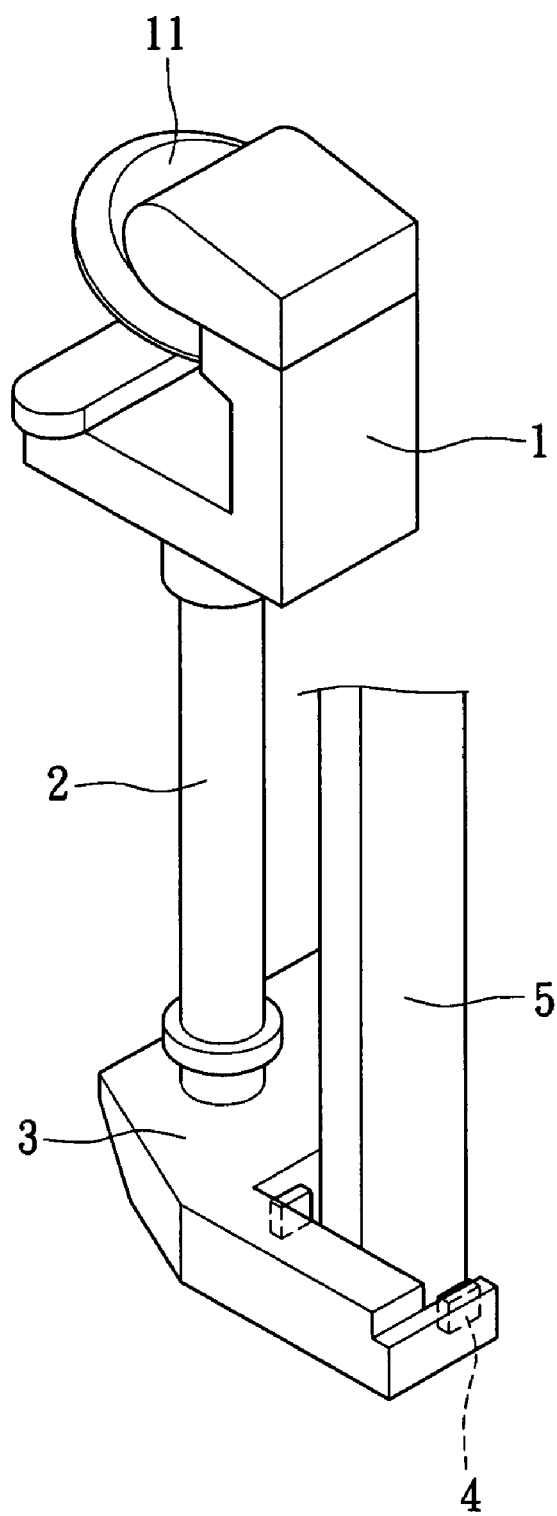
FIG. 6 is a perspective view showing an idle status of the moving module of the wafer ion-implanting machine according to a second embodiment of the present invention.

As shown in FIG. 6 which shows the second embodiment of the present invention, the top of the wafer carrier 1 is pivotally connected to the wafer tray 11. The bottom of the wafer carrier 1 is fixed onto the top of the moving shaft 2 so that the moving shaft 2 can drive the wafer carrier 1 to move lengthwise. The base 3 is fixed to the bottom of the moving shaft 2 so that the moving shaft 2 can drive the base 3 to move lengthwise. The pair of first magnets 4 is fixed to the base 3. The first magnets 4 can be permanent magnets or electrically induced magnets. The fixture body 5 can be permanent magnets or electrically induced magnets. There is no second magnet 6 on the fixture body 5. The pair of first magnets 4 respectively faces the opposite sides of the fixture body 5 so as to maintain the compelling magnetic force.

Figure 7:
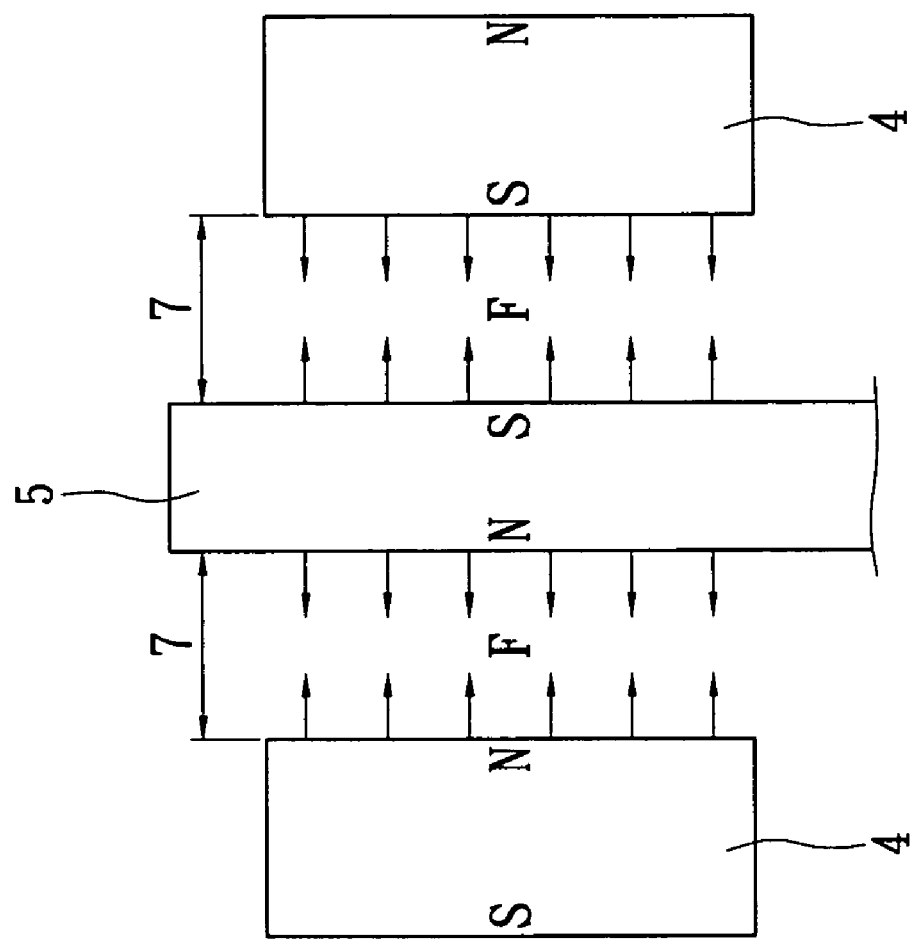
FIG. 7 is a schematic view showing the action of a magnetic force between a first magnet and a fixture body according to one embodiment of the present invention.

As shown in FIG. 7, there is the gap 7 between the fixture body 5 and the pair of first magnets 4. At least one of the first magnets 4 has a length smaller than the fixture body 5. The pair of first magnets 4 respectively faces the opposite sides of the fixture body 5 so as to maintain the compelling magnetic force.

The moving module of the present invention offers the following advantages.

1. By selecting proper magnet flux density for the first magnets 4 and the second magnets 6, it is easy to control the magnetic compelling force between the first magnets 4 and the second magnets 6. Therefore the first magnets 4 will not be in contact with the fixture body 5 and the second magnets 6, thus reducing the maintenance cost.

2. Since the first magnet 4 is not in contact with the fixture body 5 and the second magnets 6, the moving shaft 2 will not rotate so that the wafer carrier 1 will not tilt during operation. Therefore, the angle of ion implantation can be controlled more accurately, thus increasing the production yield.

3. By selecting proper magnet flux density for the first magnets 4 and the fixture body 5, it is easy to control the magnetic compelling force between the first magnets 4 and the fixture body 5. Therefore the first magnets 4 will not be in contact with the fixture body 5, thus reducing the maintenance cost.

The above-mentioned descriptions represent merely the preferred embodiment of the present invention, without any intention to limit the scope of the present invention thereto. Various equivalent changes, alternations, or modifications based on the claims of present invention are all consequently viewed as being embraced by the scope of the present invention.

What is claimed is:

1. A moving module of a wafer ion-implanting machine, comprising:
   a wafer carrier, one end of which is pivotally connected to a wafer tray;
   a moving shaft, one end of which is fixed to the other end of the wafer carrier so that the moving shaft drives the wafer carrier to move lengthwise;
   a base, which is fixed to the other end of the moving shaft so that the moving shaft drives the base to move lengthwise;
   a pair of first magnets, which are fixed to the base;
   a fixture body, which is located between the pair of first magnets; and
   a plurality of second magnets, which are fixed onto the fixture body and form a compelling magnetic force between themselves and the first magnets.

2. The moving module of claim 1, wherein the first magnets are permanent magnets.

3. The moving module of claim 1, wherein the first magnets are electrically induced magnets.

4. The moving module of claim 1, wherein the second magnets are permanent magnets.

5. The moving module of claim 1, wherein the second magnets are electrically induced magnets.

6. The moving module of claim 1, wherein the amount of the second magnets on each side of the fixture body is equal.

7. The moving module of claim 1, wherein there is a gap between each of the second magnets and each of the first magnets.

8. The moving module of claim 1, wherein the first magnets and the second magnets are in the shape of rectangle with the same size.

9. A moving module of a wafer ion-implanting machine, comprising:
- a wafer carrier, one end of which is pivotally connected to a wafer tray;
- a moving shaft, one end of which is fixed to the other end of the wafer carrier so that the moving shaft drives the wafer carrier to move lengthwise;
- a base, which is fixed to the other end of the moving shaft so that the moving shaft drives the base to move lengthwise;
- a pair of magnets, which are fixed to the base; and
- a fixture body, which is located between the pair of magnets, and is magnetic so that the pair of magnets maintain a compelling magnetic force between opposite sides of the fixture body.

10. The moving module of claim 9, wherein the magnets are permanent magnets.

11. The moving module of claim 9, wherein the magnets are electrically induced magnets.

12. The moving module of claim 9, wherein the fixture body is permanent magnets.

13. The moving module of claim 9, wherein the fixture body is electrically induced magnets.

14. The moving module of claim 9, wherein the amount of second magnets on each side of the fixture body is equal.

15. The moving module of claim 9, wherein there is a gap between the fixture body and the magnets.

16. The moving module of claim 9, wherein at least one of the magnets has a length smaller than the fixture body.

* * * * *